May 5, 1964

G. L. SCHNABLE

SEMICONDUCTOR DEVICE AND METHOD FOR THE FABRICATION THEREOF

Filed Nov. 12, 1959

3,131,454

INVENTOR.
GEORGE L. SCHNABLE
BY
Herbert Epstein
AGENT

United States Patent Office 3,131,454
Patented May 5, 1964

3,131,454
SEMICONDUCTOR DEVICE AND METHOD FOR THE FABRICATION THEREOF

George L. Schnable, Lansdale, Pa., assignor, by mesne assignments, to Philco Corporation, Philadelphia, Pa., a corporation of Delaware Filed Nov. 12, 1959, Ser. No. 852,255
6 Claims. (Cl. 29—25.3)

Figure 1:
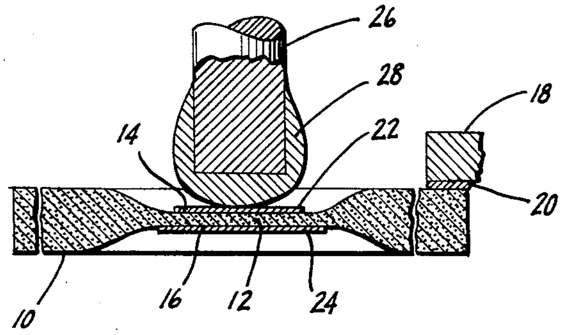

This invention relates to an improved semiconductor device and an improved method for fabricating it. More particularly it relates to an improved transistor of the type having a microalloy rectifying element and an improved method for fabricating this transistor.

Heretofore the microalloy emitter electrode of the microalloy transistor disclosed and claimed in United States Patent No. 2,870,052 of A. D. Rittmann generally has been fabricated by electroplating a disk of indium onto a wafer of n-type germanium, positioning the end of a lead wire coated with an indium-gallium alloy typically containing about 0.1 percent by weight of gallium against this indium disk, heating the indium-gallium alloy to a temperature sufficient to form a liquid mixture between it, the disk and a portion of the germanium body contiguous thereto, and cooling the mixture below its solidus point substantially immediately after it forms. This process is described more fully and claimed in copending patent application Serial No. 582,723, now Patent No. 2,930,108, filed on May 4, 1956 by Richard A. Williams and entitled "Method for Fabricating Semiconductor Devices." By performing these steps an extremely thin layer of an alloy consisting essentially of germanium, gallium and indium is formed just beneath the surface of the germanium wafer. In addition the lead wire is simultaneously bonded thereto. Because this layer is so thin, e.g. 0.001 mil, it conforms faithfully to the configuration of the wafer. Hence rectifying junctions having relatively complex configurations can be obtained by appropriately shaping the wafer surface. Moreover because the acceptor metal gallium has a high solid solubility in germanium, junctions having good minority-carrier injection properties can be obtained despite the extreme thinness of the alloyed region.

While in general the aforementioned Williams process results in the production of highly satisfactory microalloy and microalloy diffused-base transistors, under certain circumstances transistors produced thereby may be subject to certain shortcomings. In particular when the gallium content of the indium-gallium alloy used therein exceeds about 0.7 percent by weight, a liquid phase of gallium may form in the alloy. This liquid phase tends to weaken the bond formed between the lead wire and the wafer by this alloy. However when the gallium content of the solder is reduced below about 0.1 percent by weight to prevent this weakening, the amount of gallium which then alloys with the germanium wafer to form the rectifying junction may be insufficient to provide good injection of minority carriers. As a result, where the junction is employed as the emitter of a transistor, the current gain thereof may be low. In addition the indium of the indium-gallium solder tends to reduce somewhat the punchthrough voltage of the transistor by forming penetrative indium filaments within the germanium wafer during the alloying step.

Accordingly an object of my invention is to provide an improved semiconductor device.

Another object is to provide an improved rectifying element for a transistor.

Another object is to provide an improved process for forming a rectifier element in a semiconductive body.

Another object is to provide an improved process for forming a microalloy rectifier element in a germanium body and concurrently bonding a conductor thereto.

Another object is to provide an improved process of the foregoing type, by the practice of which a solder bond is obtained which is substantially stronger than that obtainable with indium-gallium alloy, and concurrently a microalloy rectifier element is obtained which has good minority-carrier injection properties.

Another object is to provide an improved process for forming microalloy rectifier elements in the germanium base element of a transistor, which forms such elements without substantially reducing the punchthrough voltage of the transistor.

The foregoing objects are achieved by providing a semiconductor device comprising a semiconductive body constituted principally of germanium and having two contiguous region. In accordance with the invention one of these regions, e.g. a microalloy region, is composed of an alloy consisting essentially of tin, indium, gallium and germanium.

The invention also resides in an improved process for fabricating such a device. This improvement consists in substituting for the indium-gallium alloy of Williams and Rittmann an alloy consisting essentially of between about 12 and about 78 percent by weight of tin, between about 0.01 and about one percent by weight of gallium and the remainder of indium. More particularly, in practicing my improved process, a surface region of a germanium body is coated with indium. A mass of the above-described tin-gallium-indium alloy is applied to this indium coating and is heated sufficiently to form a liquid mixture between the mass, the indium coating and a portion of the germanium body underlying this coating. The mixture is cooled below its solidus temperature, preferably substantially immediately after it forms. In a preferred form of this process a conductor is concurrently bonded to the semiconductive body by utilizing the alloy as a solder.

By practicing the foregoing process a microalloy region is produced in the germanium body which has good minority-carrier injection properties. In this regard a mixture of tin and indium is capable of combining with substantially more gallium than can indium alone, e.g. up to about one percent by weight, without the formation therein of a mechanically-weakening liquid gallium phase. By using a tin-indium-gallium alloy containing this relatively high concentration of gallium, rectifying contacts having excellent minority-carrier injection properties can easily be formed in germanium bodies. Furthermore it appears that gallium has a somewhat higher solid solubility in germanium when both tin and indium are present in the alloy than it has when indium alone is present therein. As a result, when the alloy contains both tin and indium less gallium need be present therein to produce a contact having satisfactory injection properties than when only indium and gallium are present in the alloy. Conversely when a relatively high gallium concentration is employed, contacts having good injection properties can be formed in germanium whose resistivity is so low as to prevent such contacts from being formed therein with an alloy composed only of indium and gallium. Because all of these tin-indium-gallium alloys are mechanically strong it is easy simultaneously to produce in a germanium body a rectifying contact having good hole-injection properties and a strong mechanical bond between this contact and a conductor.

Because of the presence of the tin in the alloy, it does not tend to form metal filaments in the germanium body even though the alloy also contains a substantial amount of indium. As a result, practice of the process of the invention does not reduce substantially the punchthrough voltage of a transistor fabricated thereby. In addition the body produced between the conductor and the germanium body by employing the above-described tin-indium-gallium alloy is at least twice as strong and as much as 18 times as strong as a similar bond formed with an alloy containing only indium and gallium. Moreover since these tin-indium-gallium alloys have melting points substantially below that of the indium coating, they form good molten solder fillets to the coating prior to dissolving it. As a result the periphery of the rectifying contact formed therewith conforms closely to that of the disk and the bond to the germanium body is strong. By contrast the indium-gallium alloy of the Williams process melts at almost the same temperature as the indium disk. As a result the alloy may not have time to form a good molten fillet to the indium disk before it melts the disk. Consequently the periphery of the rectifying contact formed therewith may deviate appreciably from that of the disk and the bond to the germanium body may be weakened.

Figure 2:
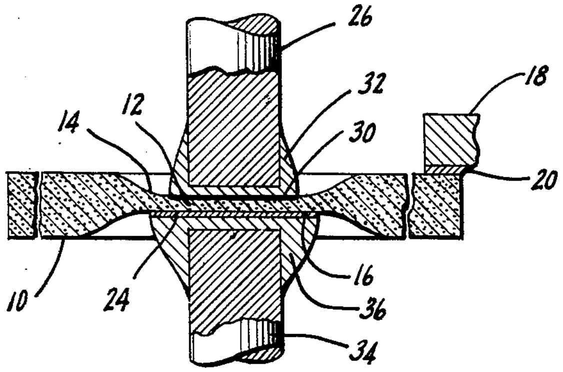

Other advantages and features of the invention will become apparent from a consideration of the following detailed description taken in connection with the accompanying drawings. FIGURES 1 and 2 of which show a transistor according to the invention at successive stages of its fabrication.

The partially completed transistor shown in FIGURE 1 comprises a rectangular wafer 10 of n-type germanium typically having a resistivity of about 1 ohm centimeter, a length of 70 mils, a width of 50 mils and a thickness of 5 mils. Wafer 10 has formed therein a thin base region 12, e.g. by electrolytically jet-etching it in a manner such as to produce opposed coaxial depressions whose respective surfaces 14 and 16 have substantially plane regions parallel to and spaced from one another by a very small distance, e.g. about 0.1 mil. A base electrode 18, which typically is a nickel tab, is secured to one end of wafer 10 by a body of solder 20 producing a substantially ohmic contact, e.g. lead containing about 0.5 percent by weight of arsenic, lead containing about 2 percent by weight of antimony, or tin.

Disks 22 and 24 composed of substantially pure indium are applied to the plane regions of surfaces 14 and 16 respectively of wafer 10, e.g. by jet-electrolytic plating. A plating solution suitable for this purpose is described hereinafter. Disk 22, beneath which an emitter junction is to be formed, has a somewhat smaller diameter than disk 24 which is to serve as the surface-barrier collector of the finished transistor. Typically disk 22 has a diameter of four mils and disk 24 has a diameter of six mils.

Next an emitter microalloy junction is formed in the region of wafer 10 beneath disk 22. To form this junction, the end of a lead wire 26 typically composed of nickel or nickel alloy and having a globule 28 of an alloy electroplated thereon is abutted coaxially against indium disk 22. In accordance with the invention, this alloy consists essentially of between about 12 and about 78 percent by weight of tin, between about 0.01 and about one percent by weight of gallium and the remainder of indium. Preferably the tin content of this alloy is between about 15 and about 35 percent by weight and the gallium content thereof is between about 0.5 and about 1 percent by weight. The latter solder has a solidus temperature of between about 120° C. and 110° C. A process for electrodepositing globule 28 on wire 26 is described hereinafter.

Globule 28 is then melted by heating it radiatively, or conductively by way of wire 26, to a temperature sufficient to cause globule 28, disk 22 and an extremly thin portion of germanium wafer 10 lying beneath disk 22 to form a liquid mixture, e.g. to a temperature of about 300° C. Almost immediately after this liquid mixture is formed, the heating is discontinued and the mixture cooled below its solidus temperature. As a result of this cooling a recrystallized region 30 (see FIGURE 2) which is only about 0.001 mil thick and contains a relatively high concentration of gallium forms within the portion of wafer 10 underlying disk 22. Because of the relatively high concentration of gallium therein region 30 is characterized by excellent hole-injection properties despite its extreme thinness. In addition, lead wire 26 is bonded to wafer 10 by a solder fillet 32 composed of tin, indium and gallium. Because this fillet 32 contains a substantial amount of tin in combination with indium and gallium, it bonds wire 26 to wafer 10 substantially more strongly than an alloy containing only indium and gallium could bond them.

Next a lead wire 34 is bonded by a solder fillet 36 to disk 24, which is to function as the surface-barrier collector of the finished transistor. To inhibit the extension of indium filaments from disk 24 into region 12, the solder employed to bond wire 34 to disk 24 preferably is composed of tin and indium, e.g. the tin-indium eutectic containing about 48 percent by weight of tin and the remainder of indium. Thereafter the region of wafer 10 adjoining and surrounding disk 24 and solder fillet 36 is subjected to an electrolytic clean-up etch in an alkaline solution, e.g. a jet of an aqueous solution containing five normal potassium hydroxide. Because the latter process is fully described in copending patent application Serial No. 798,825, now Patent No. 3,024,179, filed on March 12, 1959 by Donald P. Sanders and entitled "Semiconductor Device Fabrication," no further discussion thereof is deemed necessary herein.

The compositions and methods of preparation of the electroplating solutions mentioned above are now discussed in detail.

For jet-electroplating indium disks 22 and 24 onto wafer 10, an electrolytic solution composed of the following substances and prepared in the following manner has been found to be particularly satisfactory:

| | |
|---|---|
| Aqueous indium sulfate solution containing 0.724 gram of indium sulfate per milliliter of solution and containing less than 0.5 part per million of iron | 385 milliliters. |
| Ammonium chloride, granular, A.C.S. reagent grade | 192.6 grams. |
| Distilled or deionized water having a minimum resistivity of 12 megohm-centimeters at 25° C | To make 18 liters. |
| Iron stock solution containing per liter thereof 8.62 grams of ferric ammonium sulfate ($FeNH_4(SO_4)_2 \cdot 12H_2O$), A.C.S. reagent grade: 8 milliliters of concentrated sulfuric acid (95–98% $H_2SO_4$), A.C.S. reagent grade, and said distilled or deionized water in a quantity sufficient to make 1 liter of solution | 5.4 milliliters. |
| Aqueous solution containing 15 percent by weight of decyl benzene sodium sulfonate | 1.4 milliliters. |

In preparing this plating solution, about 15 liters of the high-resistivity water are added to a thoroughly cleansed 5-gallon Pyrex carboy. The ammonium chloride is added to this water and dissolved therein by bubbling filtered nitrogen gas therethrough for about 15 minutes. The indium sulfate solution is added to the foregoing solution and the resultant mixture is stirred by bubbling filtered nitrogen therethrough for ten minutes. Then 25 milliliters of concentrated ammonium hydroxide are added to the solution while filtered nitrogen is bubbled therethrough. The iron stock solution is added to the latter solution to increase its iron concentration to about 0.3 part per million. The solution is then diluted to 18 liters with high-resistivity water and is stirred by bubbling filtered nitrogen therethrough for about 10 minutes. Thereafter the pH of the solution is adjusted to between about 2.7 and about 3.0 by adding ammonium hydroxide thereto if the pH is too low, or hydrochloric acid if the pH is too high. After each addition of the pH-adjusting reagent the solution is stirred by bubbling filtered nitrogen therethrough for at least 10 minutes before measuring the new pH. After its pH has been adjusted properly, the solution is filtered through paper into a clean 5-gallon polyethylene bottle which is then capped. Just before using this filtrate for jet-electrolytic plating, the decyl benzene sodium sulfonate solution is added thereto.

To electroplate disks 22 and 24 onto surfaces 14 and 16 respectively of wafer 10, substantially coaxial jets of the plating solution are directed against these respective surfaces, and a potential difference exceeding the deposition potential of indium is applied between the jets and wafer 10 in a direction such as to pole wafer 10 negative with respect to the jets. As a result indium disks 22 and 24 are electrodeposited. This indium plating technique is described and claimed in copending patent application Serial No. 852,162, now Patent No. 3,032,484, filed November 12, 1959, by Donald P. Sanders and entitled "Jet-Plating Method of Manufacture of Micro-Alloy Transistors."

Globule 28 composed of tin-indium-gallium alloy is affixed to an end of lead wire 26 by employing the process described and claimed in United States Patent No. 2,818,375. For this purpose an electrolytic solution composed of the following constituents and prepared as follows has been found satisfactory:

| | Grams |
|---|---|
| Glycerine, minimum assay 95% by volume of glycerol, A.C.S. reagent grade | 1600 |
| Indium trichloride, anhydrous powder, prepared from 99.97 percent by weight pure indium metal, minimum assay 96% by weight of $InCl_3$ | 150 |
| Stannous chloride, anhydrous | 30 |
| Ammonium chloride, granular, A.C.S. reagent grade | 160 |
| Ammonium chlorogallate-ammonium chloride mixture anhydrous, assay as $GaCl_3$ approximately 60% | 7 |

In preparing this solution, the above-listed salts are added to the glycerine and the mixture stirred vigorously for about 5 minutes at room temperature. Thereafter, while undergoing continual stirring, the mixture is heated to a temperature of between about 135° C. and about 145° C. and is maintained thereat for about 10 minutes. Then the solution is heated to a temperature of between about 158° C. and about 162° C. and is maintained thereat for about 5 minutes. The temperature of the resultant solution is permitted to fall to about 120° C. and the solution is then filtered under suction through a fritted glass filter.

This filtrate can be used as the plating solution for lead wire 26. However because this solution has a relatively high surface tension, the hydrogen gas evolved at the lead wire during plating forms relatively large bubbles therein. When these bubbles burst, they spray filtrate on equipment adjacent the plating bath, e.g. on metal jaws used to support and make electrical contact to the wire. This spraying is undesirable because the filtrate tends to corrode these jaws.

To minimize this spraying, the surface tension of the filtrate is reduced by adding a surfactant thereto. This surfactant is a solution composed of about 15 grams of dodecyl benzene sodium sulfonate, 35 millilieters of water and sufficient glycerine to make 100 milliliters. About 3.3 milliliters of this surfactant solution are added to the filtrate after its temperature falls to about 80° C. and the mixture is stirred slowly for about 5 minutes to form a homogeneous solution.

To plate globule 28 of tin-indium-gallium solder onto lead wire 26, a suitable quantity of the above-described solution is established at a temperature of between about 130° C. and about 140° C., while dry argon or dry nitrogen is passed over the surface of the solution to prevent it from acquiring moisture from the room atmosphere during plating. Wire 26 is then immersed in the plating solution to a depth of about 0.9 mil and a potential difference of about 12 volts is applied between wire 26 and an inert anode immersed at least one-half inch into the solution. Typically this anode is a rod ⅛ inch in diameter composed of spectroscopically pure carbon. Under these conditions globule 28 of a ternary alloy consisting essentially of about 30 percent by weight of tin, about 0.5 percent by weight of gallium and the remainder of indium rapidly electrodeposits in molten form onto wire 26. For example an ellipsoidal globule of this alloy weighing about 3 to 4 micrograms is electrodeposited in about 1.5 seconds on a nickel wire having a diameter of 1.5 mils. After globule 28 has deposited on wire 26, the potential difference is removed and wire 26 is taken out of the plating solution.

Wire 26 is now ready to be bonded to wafer 10 by practicing the soldering and cooling steps described above. Because the tin-indium-gallium plating solution is relatively viscous at 140° C., a layer of it clings to globule 28 upon its removal therefrom. This layer serves as an excellent flux for the succeeding soldering step and hence no additional flux need be applied to globule 28 or disk 22 to achieve good soldering.

In the foregoing example a preferred method for plating an alloy of specific composition has been set forth. However solder globule 28 need not be electroplated onto lead wire 26. While this method has proved in practice to be well adapted for use on an automated assembly line and therefore is preferred, the globules may be prepared instead by non-electrolytic processes, e.g. by melting together appropriate amounts of the solder metals and thereafter forming alloy pellets of appropriate size from this melt. Each pellet then may be affixed to a lead wire by warming the pellet to its softening temperature and thrusting the end of a wire into it. Alternatively an uncoated lead wire may be abutted against the indium disk and the appropriate solder introduced between the disk and the wire in any other manner desired.

Moreover in each of the foregoing examples the germanium body has been designated as n-type. However alloy-junction rectifying electrodes of the above-described type also can be formed in intrinsic germanium. Moreover while the foregoing composition of the tin-indium-gallium alloy is preferred because of its excellent soldering properties and reliable alloying properties it is entirely feasible to use tin-indium-gallium alloys of different compositions. In particular it has been found that the advantages according to the invention can be obtained where the alloys have a tin content of between about 12 and about 78 percent by weight, a gallium content of between about 0.01 and about one percent by weight and the remainder of indium. Superior results are obtained when the alloy has a tin content between about 20 and about 50 percent by weight and a gallium content between about 0.1 and about one percent by weight. Preferably the tin content is maintained between about 25 and about 35 percent by weight and the gallium content is maintained between about 0.5 and about 1 percent by weight.

The gallium content of the alloys plated from the above-described bath can be varied readily by varying the amount of gallium salt present in the bath. In this regard it is entirely feasible to plate tin-indium-gallium alloys from baths of the aforedescribed type which contain as little as 1 gram and as much as 10 grams of the ammonium chlorogallate-ammonium chloride mixture, where the other constituents of the bath have the above-listed masses.

Although the foregoing example teaches specifically the formation in accordance with the invention of the emitter electrode of a microalloy transistor, it is to be understood that the process of the invention can also be used to form the rectifier electrodes of diodes and other kinds of transistors, e.g. microalloy diffused-base transistors.

While I have described my invention by means of specific examples and in a specific embodiment, I do not wish to be limited thereto, for obvious modifications will occur to those skilled in the art without departing from the scope of my invention.

What I claim is:

1. In the fabrication of a rectifying junction in a body of n-type germanium, the steps of: coating a surface region of said body with indium; applying to said indium coating a mass of a metal consisting essentially of between about 12 and about 78 percent by weight of tin, between about 0.01 and about one percent by weight of gallium and the remainder of indium; heating said mass sufficiently to form a liquid mixture composed of said metal, said coating and a portion of said germanium body underlying said coating, and cooling said mixture below its solidus temperature.

2. The method of forming a rectifying junction in a body of n-type germanium and concurrently bonding a conductive structure to said body, comprising the steps of: coating a region of said body with indium; applying between said structure and said coating an alloy consisting essentially of between about 12 and about 78 percent by weight of tin, between about 0.01 and about one percent by weight of gallium and the remainder of indium, heating said alloy sufficiently to form a liquid mixture between a portion of said germanium body, said indium coating and said alloy, and cooling said mixture below its solidus temperature thereby to form said rectifying junction and bond said structure to said body.

3. A method according to claim 2, wherein said step of coating said region with indium includes the step of electroplating said indium onto said region.

4. A method according to claim 2, wherein said step of applying said alloy between said structure and said coating comprises the steps of coating a portion of said structure with said alloy and then abutting said coated portion of said structure against said coated region of said body.

5. In a method of fabricating a transistor having a body of n-type germanium, the steps of: electrolytically plating indium on a surface of said body; positioning adjacent said indium plating a conductor and a solder consisting essentially of between about 20 and about 50 percent by weight of tin, between about 0.1 and one percent by weight of gallium and the remainder of indium; heating said solder sufficiently to form a liquid mixture composed of said solder, said one indium plating and a portion of said germanium body contiguous the latter plating; and cooling said mixture below its solidus temperature substantially immediately after said mixture forms, thereby to form a rectifying junction in said body and connect said conductor to said junction.

6. A method according to claim 5, wherein the tin content of said solder is between about 25 and about 35 percent by weight and the gallium content of said solder is between about 0.5 and about one percent by weight.

References Cited in the file of this patent

UNITED STATES PATENTS

| | | |
|---|---|---|
| 2,852,722 | Noon | Sept. 16, 1958 |
| 2,853,662 | Woods | Sept. 23, 1958 |
| 2,918,719 | Armstrong | Dec. 29, 1959 |
| 2,925,643 | Haayman et al. | Feb. 20, 1960 |
| 2,930,108 | Williams | Mar. 29, 1960 |
| 2,942,166 | Michlin | June 21, 1960 |
| 2,953,693 | Philips | Sept. 20, 1960 |
| 2,977,262 | Carlson et al. | Mar. 28, 1961 |
| 3,005,735 | Schnable | Oct. 24, 1961 |
| 3,046,651 | Olmon et al. | July 31, 1962 |